United States Patent
Mikhael et al.

(10) Patent No.: US 6,468,595 B1
(45) Date of Patent: Oct. 22, 2002

(54) VACCUM DEPOSITION OF CATIONIC POLYMER SYSTEMS

(75) Inventors: Michael G. Mikhael; Angelo Yializis, both of Tucson, AZ (US)

(73) Assignee: Sigma Technologies International, Inc., Tucson, AZ (US)

(*) Notice: Subject to any disclaimer, the term of this patent is extended or adjusted under 35 U.S.C. 154(b) by 74 days.

(21) Appl. No.: 09/783,926

(22) Filed: Feb. 13, 2001

(51) Int. Cl.$^7$ .................... C23C 16/00; C23C 16/48; B05D 3/06; C08J 3/28
(52) U.S. Cl. .................. 427/497; 427/509; 427/585; 427/255.11; 427/255.6; 427/255.7; 522/15; 522/25; 522/29; 522/31; 522/66; 522/167; 522/168; 522/170; 522/181; 522/188; 522/186
(58) Field of Search ................ 427/497, 509, 427/585, 255.11, 255.6, 255.7; 522/15, 25, 29, 31, 66, 168, 170, 181, 188, 167, 186

(56) References Cited

U.S. PATENT DOCUMENTS

| | | | | |
|---|---|---|---|---|
| 4,543,275 A | * | 9/1985 | Akashi et al. | 427/250 |
| 4,604,294 A | * | 8/1986 | Tanaka et al. | 427/255.14 |
| 4,842,893 A | * | 6/1989 | Yializis et al. | 427/251 |
| 4,954,371 A | * | 9/1990 | Yializis | 392/399 |
| 5,260,095 A | * | 11/1993 | Affinito | 427/124 |
| 5,440,446 A | | 8/1995 | Shaw et al. | 361/301.5 |
| 5,681,615 A | | 10/1997 | Affinito et al. | 427/255.6 |
| 5,725,909 A | | 3/1998 | Shaw et al. | 427/412.1 |
| 5,811,183 A | * | 9/1998 | Shaw et al. | 428/336 |
| 5,902,641 A | | 5/1999 | Affinito et al. | 427/255.2 |
| 6,010,751 A | | 1/2000 | Shaw et al. | 427/255.7 |
| 6,020,508 A | | 2/2000 | Nikolic et al. | 549/512 |
| 6,040,017 A | | 3/2000 | Mikhael et al. | 427/496 |
| 6,045,864 A | * | 4/2000 | Lyons et al. | 427/255.23 |
| 6,214,422 B1 | * | 4/2001 | Yializis | 427/255.6 |
| 6,224,948 B1 | * | 5/2001 | Affinito | 427/255.6 |
| 6,358,570 B1 | * | 3/2002 | Affinito | 427/384 |

* cited by examiner

Primary Examiner—Susan W. Berman
(74) Attorney, Agent, or Firm—Antonio R. Durando; Durando Birdwell & Janke PLC

(57) ABSTRACT

A thermally-stable cationic photoinitiator capable of flash vaporization under vacuum and temperature conditions of an available flash-evaporation chamber is selected. The photoinitiator is mixed with a cation-polymerizable monomer and/or oligomer of interest and the mixture is flash evaporated and condensed in conventional manner as a film on a cold substrate. The resulting vacuum-deposited, homogeneous layer is cured with a high-energy radiation source that causes the cationic photoinitiator to liberate acidic species that catalyze the crosslinking of the monomer/oligomer compounds in its deposited film form. As a result of the homogeneous, pinhole-free nature of the vacuum deposition process, the thin-film polymer product does not suffer from the disadvantages attendant to prior-art atmospheric processes for cationically-cured polymers. In addition, because of the versatility afforded by vacuum deposition, hybrid films of such polymers with inorganic materials are also easily manufactured in-line during the same process.

33 Claims, 1 Drawing Sheet

VACCUM DEPOSITION OF CATIONIC POLYMER SYSTEMS

BACKGROUND OF THE INVENTION

1. Field of the Invention

This invention is related in general to the process of manufacture of cationic polymer thin films by vacuum vapor deposition. In particular, it pertains to a process of flash evaporation, vapor deposition, and radiation curing of cation-polymerizable monomers and oligomers.

2. Description of the Related Art

Inorganic and polymeric coatings are used on various substrates to add or promote desirable properties for particular applications. For example, foils used to preserve food need to have very low permeability to oxygen. Therefore, it is desirable and sometimes necessary to modify the physical properties of polymeric films to improve their suitability for the intended purpose. Preferably, the films are directly formed with a composition and molecular structure characterized by the desired properties.

Thin films of metals, ceramic and polymers are created by deposition onto appropriate substrates by a variety of known processes, most notably through film formation by wet chemistry or vapor deposition. Chemical processes produce soluble thermoplastic as well as insoluble thermoset polymers and involve the use of solvents; thus, thin film formation is achieved through solvent diffusion and evaporation. As a result, these processes require relatively long residence times and the undesirable step of handling solvents.

Vacuum deposition processes involve the flash evaporation of a liquid monomer in a vacuum chamber, its deposition at room temperature or on a cold substrate (referred to in the art as "crycondensation"), and the subsequent polymerization by exposure to a high-energy source of radiation, such as electron beam or ultraviolet radiation. As illustrated schematically in FIG. 1, the liquid monomer from a supply reservoir 12 is fed through a capillary tube 14 and an atomizer 16 into the heated evaporator section of a vacuum deposition chamber 10, where it flash vaporizes under vacuum. The resulting monomer vapor is then passed into a condensation section of the unit where it condenses and forms a thin liquid film upon contact with the cold surface of an appropriate substrate, such as a film 18, which in turn is in contact with a cold rotating drum 20 as it progresses from a feed roll 22 to a take-up roll 24. A metal vaporization unit 26 may also be used to deposit in line a thin metal layer on the film 18 for multilayer deposition. The liquid deposited film is then cured by exposure to an electron-beam or ultraviolet radiation source 28. A duplicate polymer coating system with a corresponding liquid monomer supply reservoir 12', capillary tube 14', atomizer 16', and radiation source 28' may be utilized to apply multiple monomer coats over the film substrate 18. Since the ultimate objective is the formation of solid films, the initial liquid monomer must be capable of polymerization and contain enough reactive groups to ensure that a sufficiently large polymeric molecule results and yields a solid product. A conventional plasma-gas treating system 30 is also used to clean and prepare the film 18, if desired.

This conventional approach of utilizing a polymerizable monomer as the raw material for thin-film forming processes has been followed over the years because it is not possible to vaporize the final polymeric product under the range of operating conditions of a commercially viable vapor deposition chamber (typically, $10^{-3}$ to $10^{-6}$ torr and 70° C.–350° C.). The higher temperatures required to effect the vaporization of polymers having molecular weight greater than about 5,000 would destroy the polymer. Thus, the practice in the industry has been to identify or develop polymers having specific characteristics deemed advantageous for a particular film application. A solid thin film of the polymer is then formed on a target substrate by evaporating the corresponding monomer or oligomer, cryocondensing it as a monomer or olygomer in liquid form and polymerizing or cross-linking it to reach the required molecular weight to ensure its solidification. Many variations of this basic approach have been developed for particular applications, but conventional prior-art vacuum deposition processes involve the formation of a solid film by polymerization of a liquid monomer evaporated under vacuum or atmospheric conditions and recondensed on a cold surface to obtain the desired film characteristics.

The high rate of deposition and the better quality of the coatings produced make the vacuum film-forming process a commercially preferred technique. Therefore, considerable research has been conducted to develop processes for improving the properties of thin films obtained by polymerization of vacuum deposited monomers and oligomers. See, for example, U.S. Pat. Nos. 5,681,615, 5,440,446, 5,725,909, 5,902,641 and 6,010,751. A new approach to overcome some process limitations, involving the flash evaporation of oligomers, has been disclosed in U.S. Pat. No. 6,270,841, hereby incorporated by reference.

In the prior art, vacuum deposition and radiation curing have been used only with monomers and oligomers that polymerize via the free-radical polymerization mechanism. As such, mostly acrylates and methacrylates have been utilized to produce a variety of useful film products. When electron-beam radiation is applied, no initiator is needed because electrons are capable of creating the free radicals that initiate the polymerization. If ultraviolet or other high-energy photoradiation is used, free-radical photoinitiators such as aromatic ketone derivatives are used. These are non-ionic, easy-to-evaporate organic molecules.

By contrast, vacuum deposition of cation-polymerizable monomers or oligomers has not been available because conventional Lewis-acids and Bronstead-acids cationic initiators cause the polymerization reaction to start at room temperature before flash evaporation can be carried out. Even photoactive aryldiazonium cationic initiator salts are not sufficiently thermally stable to survive the flash evaporation process. In addition, earlier generations of vacuum equipment (atomizers, evaporators and nozzles) were not efficient for flash evaporation of mostly heterogeneous cationic systems that contain thermally stable, low-vapor-pressure cationic photoinitiator salts. Moreover, the commercial availability of cationic polymerization systems (monomers, oligomers and initiators) was limited.

These limitations thus made it impractical to attempt to use flash-evaporation vacuum-deposition technology for cationic polymerization systems, especially for commercial applications that require high rates of coating, superior properties, and low costs. As a result, the advantages afforded by the combination of flash-evaporation vacuum-deposition coating techniques (solventless, defect-free, ultra-thin, and in-line metallization) and cationically polymerized coatings (excellent adhesion, high barrier, electrochemical stability, high dielectric strength and low infrared absorption) have not been obtained in a single product.

Because of the poor solubility of cationic-photoinitiator salts in monomer or oligomer blends, most cationic polimerization reactions require solvents to produce the formation of homogeneous polymeric products. Solvent-based formulations are inherently incompatible with vacuum-deposition techniques. However, the process of flash evaporation followed by vacuum deposition overcomes the problem of photoinitiator solubility and produces a clear homogeneous coating because of the very short time between deposition and curing, which does not allow phase separation, even starting with a heterogeneous monomer/initiator blend.

During the last few years, progress has been made in different areas which set the stage for attempting the processing of cationically polymerizable monomers and oligomers as commercial coating materials via flash evaporation, vacuum deposition and radiation crosslinking techniques. Thermally stable, photoactive, cationic initiators (e.g., diaryliodonium, triarylsulfonium and ferrocenium salts) have been developed and have become commercially available. These cationic initiators are completely inactive at ambient conditions. They are themselves activated by either electron beam or ultraviolet radiation. Therefore, the possibility of combining them with cationically polymerizable monomers and oligomers in a flash-evaporation process became more realistic.

Thermally stable, photoactive, cationic initiators have been used extensively for conventional cationic polymerization processes, but mostly in solvent systems and only at atmospheric conditions. See, for example, U.S. Pat. No. 6,020,508. In related research work, non-ionic, metal free, organic soluble cationic photoinitiators were also synthesized and investigated for atmospheric systems (Mikhael et al, Nacromolecules, 28, 5951, 1995). These initiators were not initially thought to be good candidates for flash evaporation because of their very low volatility.

Besides the recent developments that led to the commercial availability of thermally stable cationic photoinitiator salts, a larger variety of cationically polymerizable monomers and oligomers (e.g., vinyl ethers, cycloaliphatic epoxy, glycidyl derivatives, styrene derivatives, divinyl styrene, oxetanes, vinyl pyridine, vinyl carbazole, vinyl imidazole) have also become commercially available. In addition, a new generation of monomer-evaporating units has become available with larger surface areas, multiple injectors, and shorter path to the nozzle, which justified attempting the flash evaporation of cationic photoinitiator salts (which have a much lower vapor pressure than the free radical photoinitiators used for acrylates) together with cationically polymerizable monomers and oligomers, hoping to avoid the premature thermal polymerization or salt separation. The present invention consists of a viable process for the production of polymer coatings from cation-polymerizable monomers and oligomers through flash evaporation, vacuum deposition, and radiation curing.

BRIEF SUMMARY OF THE INVENTION

The main objective of this invention is the flash evaporation, vacuum deposition and radiation curing of cation-polymerizable, non-acrylate, monomers and oligomers.

Another objective is a process for producing cation-polymerized coatings at a high production rate.

Another object is the production of cation-polymerized coatings in a solvent-free environment.

Yet another object is the production of cation-polymerized coatings in high-barrier pinhole-free films.

Still another objective is a process that can be implemented to coat large surface areas.

Another goal is a process that produces cation-polymerized coatings in highly uniform, defect-free, ultrathin films (0.01–10 microns).

Specifically, a goal of the invention is a process for manufacturing thin films of cation-polymerized polymer composites with superior barrier properties, electrochemical stability, dielectric strength and infrared transmittance than exhibited by prior-art (acrylate-based) coatings.

Another specific goal is a process that produces hybrid films of cation-polymerized polymers and inorganic materials, such as metals and/or ceramics.

Another objective is a procedure that can be implemented utilizing prior-art flash-evaporation vapor-deposition technology.

A final objective is a procedure that can be implemented easily and economically according to the above stated criteria.

Therefore, according to these and other objectives, the present invention consists of selecting a thermally stable photoactive (chemically inactive at ambient conditions) cationic initiator suitable for polymerizing non-acrylate cationically-polymerizable monomers or oligomers of interest and capable of vaporization under vacuum and temperature conditions of available flash-evaporation chambers. Such photoinitiator is mixed with monomers and/or oligomers similarly suitable for vaporization under the same vacuum and temperature conditions; and the mixture is flash evaporated and cryocondensed in conventional manner as a film on a cold substrate. The resulting vacuum-deposited, homogeneous, highly uniform layer is then cured with a high-energy radiation source that causes the cationic photoinitiator to dissociate into acidic species that initiate the cationic crosslinking reaction of the monomer/oligomer compounds in its deposited film form. As a result of the homogeneous, solventless pinhole-free nature of the vacuum deposition process, the thin-film polymer product does not suffer from the disadvantages attendant to prior-art atmospheric processes for cationically-cured polymers. In addition, because of the versatility afforded by vacuum deposition, hybrid films of such polymers with inorganic materials are also easily manufactured in-line during the same process at higher rate than that of conventional atmospheric coating processes.

Various other purposes and advantages of the invention will become clear from its description in the specification that follows and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose but one of the various ways in which the invention may be practiced.

DESCRIPTION OF THE PREFERRED EMBODIMENTS OF THE INVENTION

Figure 1:
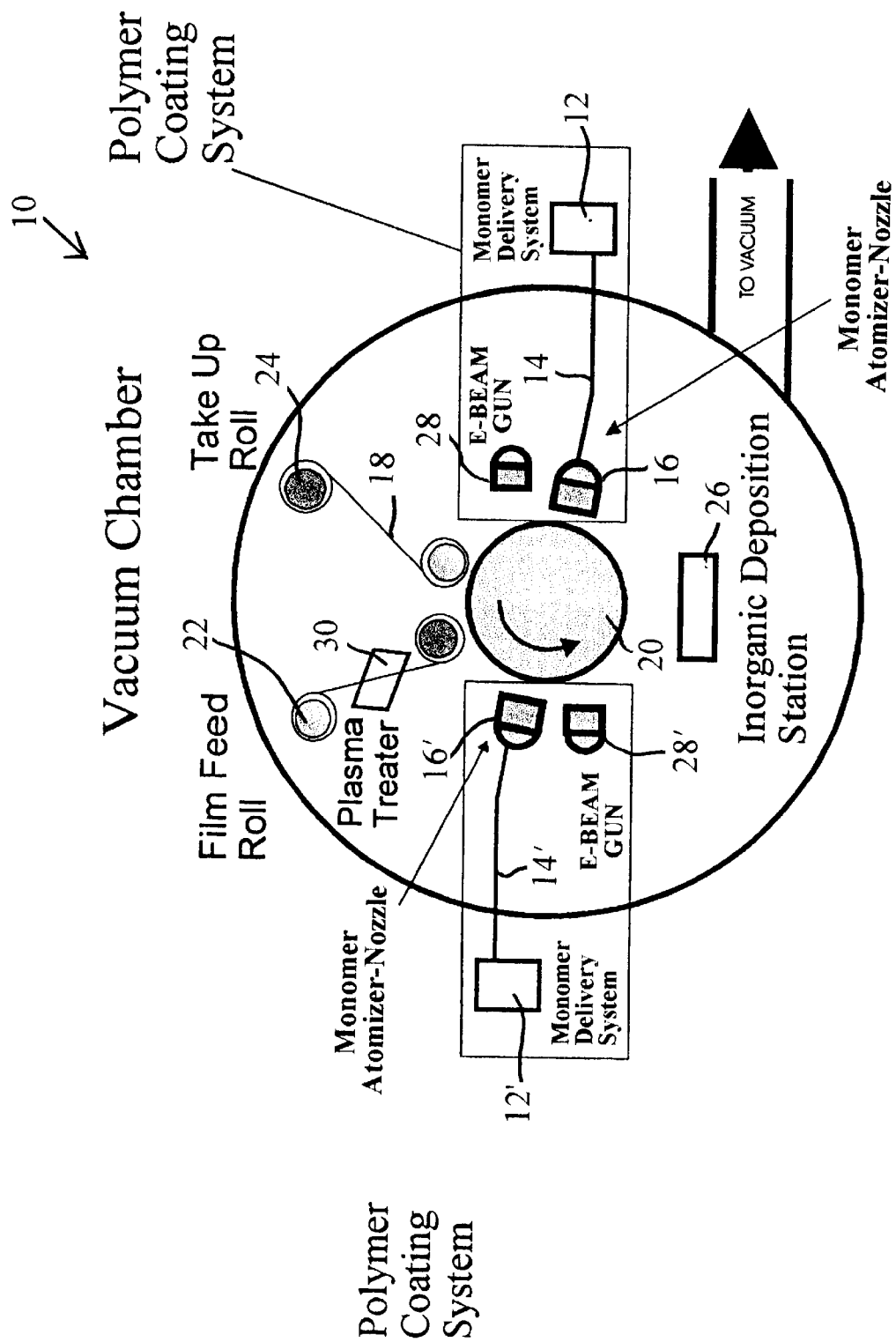
FIG. 1 is a schematic representation of a prior-art vacuum vapor deposition and radiation curing unit.

One aspect of the present invention lies in the recognition that some thermally stable photoactive cationic initiator salts can be flash evaporated and vacuum deposited under selected operating conditions. Based on this realization, it became likely that the manufacture of polymer-coating thin films by vacuum vapor deposition of cationically-crosslinkable monomers and oligomers could also be possible by judiciously selecting vaporizable, completely inactive at ambient conditions, thermally stable cationic photoinitiators. Accordingly, the invention consists of flash evaporating, condensing, and then irradiating a particular cationically-curable, non-acrylate, monomer or oligomer of interest mixed with such a thermally stable photoinitiator, so that no curing occurs prior to exposure of the deposited film to a high-energy radiation source.

As used herein, the term oligomer is intended to refer not only to molecular chains normally designated as such in the art (typically containing between two and ten monomer molecules) but also to low-molecular weight polymers; specifically, oligomer is meant to encompass any polymerized molecule having a molecular weight sufficiently low to permit its vaporization under vacuum at a temperature lower than its temperature of thermal decomposition. With current vacuum technology, such maximum molecular weight is approximately 5,000, the precise molecular weight depending on the specific monomer used, but it is understood that greater molecular weights would become available for inclusion in the practice of the invention if greater vacuum conditions were obtained. Therefore, the invention is not to be limited to polymeric chains with molecular weight less than about 5,000, but is intended to include any polymeric molecule, herein defined as oligomeric, that is capable of vaporization at a temperature lower than the temperature at which it decomposes or otherwise degrades. For convenience of description, such oligomers are included for the purposes of this disclosure within the definition of term "monomer," which is mostly used alone to describe the invention.

As is well understood in the art, the term cryocondensation refers to a phase-change process from vapor to liquid obtained upon contact with a surface having a temperature lower than the dew point of the gas at a given operating pressure. Since vapor deposition can also occur at room temperature, the terms condensation and cryocondensation are used interchangeably for the purposes of this disclosure to describe the vapor condensation step of the invention. The term thin film is intended to encompass any layer of material with a thickness in the order of microns or sub-microns, the thickness typically consisting of polymeric films produced either by vapor deposition or by wet-chemistry processes. The term degradation is used interchangeably with the term decomposition which includes the premature uncontrolled thermal polymerization. Finally, any cationically-curable monomer and any cationic photoinitiator used to practice the invention must have a vaporization temperature that is below its decomposition temperature at the operating pressures of conventional vapor deposition chambers ($10^{-1}$ to $10^{-6}$ torr), and that is also within the temperature operating range of such equipment (70° C.–350° C.).

A cationically-curable monomer is defined as any organic molecule functionalized with one or more electron rich π-bond and/or hetrocyclic ring structures. These are non-acrylate molecules that are capable of high-rate cationic photopolymerization and crosslinking. Table 1 shows examples of various cationically polymerizable molecules.

TABLE 1

Examples for Cationically Polymerizable Molecules.

| Vinyl ethers | R—O—CH=CH$_2$ |
| Styrene and its derivatives | R—C$_6$H$_4$—CH=CH$_2$ |
| Glycidyl ether derivatives | R—O—CH$_2$—CH—CH$_2$ (epoxide) |
| Epoxy derivatives | R—CH—CH$_2$ (epoxide) |
| Cycloaliphatic epoxy | R—cyclohexyl epoxide |
| Vinyl pyridine and its derivatives | R-substituted vinyl pyridine |
| Vinyl carbazole and its derivatives | N-vinyl carbazole with R |
| Dienes | R$_2$C=C(R)—C(R)=CR$_2$ |
| Oxetane derivatives | R-substituted oxetane |

R, is hydrogen or any other organic moiety

The main requirement for a cationically polymerizable monomer is electron-donating atoms or groups attached to the π bond or the heterocyclic ring. This makes the monomer's polymerizable functional group electron rich and more reactive towards the positively charged acidic species produced by the photo dissociation of the cationic initiator. Epoxies, cycloaliphatic epoxies, vinyl ethers, styrene, styrene derivatives, glycidyl derivatives, vinyl pyridines, vinyl carbazoles, oxetanes, and dienes have all been found to be suitable monomers for the process of the invention.

Thermally stable, chemically inactive at room temperature, cationic photoinitiators are defined as organic salts that dissociate into acidic species when exposed to high-energy radiation. These cationic photoinitiators should be thermally stable enough to survive the flash evaporation process without heat dissociation which may cause premature polymerization inside the evaporating unit. (Chemically-stable cationic initiators that release acidic species when exposed to heat are expressly excluded from the definition of cationic photoinitiators for the purposes of this invention, even if they are also activated by exposure to radiation.) Diaryl iodonium salts and triaryl sulfonium salts have been found to be particularly suitable initiators to practice the invention.

Moreover, for the purposes of the present disclosure, high-energy radiation is defined as either electron-beam radiation or naturally occurring or artificial radiation having wavelength less than about 0.7 micron and capable of producing chemical changes also referred to in the art as actinic radiation.

The crux of the invention lies in the realization that some thermally stable cationic photoinitiators consist of very large size cations and anions (salt molecules) which, notwithstanding their ionic nature, are capable of vaporization because of their relatively weak ionic character. These salts have highly non-nucleophilic anions, such as $PF_6^-$, $AsF_6^-$, and $SbF_6^-$. The low nucleophilicity of these anions reduces the termination and chain transfer processes and allows a longer propagation step of cationic polymerization reactions. Accordingly, the inventors successfully tested diaryl iodonium hexafluoroantimonate and triaryl sulfonium hexafluoroantimonate salts, under conventional vacuum evaporation and deposition conditions. The discovery prompted the successful implementation of flash evaporation, vacuum deposition, and subsequent curing by irradiation of cationically-curable monomers previously processed only under atmospheric conditions.

The following examples illustrate the invention.

EXAMPLE 1

A cycloaliphatic epoxy monomer (3,4-epoxycyclohexylmethyl-3,4-epoxycyclohexane carboxylate), 99% w/w, was mixed with a thermally stable cationic photoinitiator (diaryl iodonium hexafluoroantimonate), 1% w/w. The mixture was heated to 60° C. and stirred for 10–15 minutes. The blend was transferred to the monomer delivery unit of a vacuum chamber (FIG. 1) and injected into a pre-heated evaporator at 200° C. The material was evaporated under vacuum (about $5 \times 10^{-4}$ Torr) and recondensed on a plasma-treated (for cleaning and preparation) plastic film running at 300 ft/min and in good contact with a cold drum. Immediately after recondensation, the condensed liquid layer was irradiated with electron beam radiation (10 KV, 100 mA) and crosslinked. The resulting plastic substrate coated with a clear, 0.1-micron, polycycloaliphatic epoxy film was tested for its adhesion, surface energy, chemical stability, and mechanical properties.

The film showed 100% adhesion to the substrate, which was achieved without adding any adhesion promoter material to the monomer. This may be attributed to the cationic polymerization mechanism of the epoxy monomers which creates hydroxyl groups (—OH) or hydroxide ions during the crosslinking process. These groups or ions dramatically enhance the adhesion to either plastic or inorganic (metal or ceramic) substrates.

The process also produced a high surface-energy (50–54 dyne/cm) coating, which was obtained without oxygenated additives (e.g., acids, alcohols, ethers). This makes the coating a perfect material for printing, laminating and adhering. The coating also exhibited very high chemical stability and mechanical properties.

EXAMPLE 2

This example was conducted as Example 1, but increasing the monomer feed rate to deposit a one-micron crosslinked coating. The resulting coated film showed properties similar to those reported for Example 1, with a higher hardness (4H–5H on the pencil test) for the thicker coating.

EXAMPLE 3

Same as Example 1, but ultraviolet radiation (300 W/inch mercury lamp) was used for curing instead of the electron beam. The same properties were found in the resulting coating.

EXAMPLE 4

Same as Example 1, where the substrate was a metalized plastic film. Two different line speeds, 200 and 800 ft/min, were applied to obtain 1.0 and 0.25 micron coatings, respectively. Moisture vapor transmittance rate (MVTR) and oxygen transmittance rate (OTR) were tested for the metalized film coated with 0.25-micron cycloaliphatic epoxy film. Table 2 shows the barrier data (MVTR, OTR) for metalized uncoated film, metalized acrylate-coated film and metalized epoxy-coated film of the same thicknesses.

TABLE 2

| Film Type | MVTR, 38° C., 90% RH ($g/m^2/day$) | OTR, 23° C., 0% RH ($cc/m^2/day$) |
| --- | --- | --- |
| Metalized uncoated polyester film | 2.3 | 26 |
| Metalized acrylate coated polyester film | 0.23 | 3.3 |
| Metalized epoxy coated polyester film | 0.09 | 0.38 |

The same materials and conditions were used to build multilayer gas-and vapor-barrier structures over a polyethyleneglycol terphthlate (PET) base film consisting of the following layers: PET-base-film/Al/epoxy/Al/epoxy/Al/epoxy; and PET-base-film/epoxy/Al/epoxy/Al/epoxy/Al/epoxy. The second structure, with an epoxy layer between the base film and the first metal layer, helps to improve the base-film surface properties, so that a lower grade PET material can be used to achieve the performance of higher grade, more expensive substrate materials. This multilayer coating showed ultra-high barrier for both oxygen and moisture (WVTR<0.005 $cc/m^2/day$ and OTR<0.005 $cc/m^2/day$). Similar results are obtainable when other inorganic barrier materials, such as aluminum oxide, silicon oxide, and indium tin oxide (ITO), are used in the multilayer structure instead of aluminum metal. Plasma treatment of any layer could be used if needed to enhance adhesion between layers.

EXAMPLE 5

Same as Example 4, where the substrate was a ceramic-coated ($SiO_2$ or $Al_2O_3$) plastic film. Two different line speeds, 200 and 800 ft/min, were applied to obtain 1.0 and 0.25 micron coatings, respectively.

EXAMPLE 6

Same as Example 1, where tri(ethylene glycol) divinyl ether was used as a monomer instead of the cycloaliphatic epoxy. The same cationic photoinitiator and processing conditions of Example 1 were used in this experiment. A higher crosslinking rate was observed for this system, which made it possible to run at higher speeds.

EXAMPLE 7

Same as Example 1, where a 1:1 mixture of tri(ethylene glycol) divinyl ether and 3,4-epoxycyclohexylmethyl-3,4-epoxycyclohexane carboxylate was used as a monomer blend.

EXAMPLE 8

A hybrid cationic/free-radical polymerization system was tested by mixing 3,4-epoxycyclohexylmethyl-3,4-epoxycyclohexane carboxylate with hexanediol diacrylate (1:1 ratio) and evaporating the blend at 200° C. and $5\times10^{-4}$ torr, then curing the condensed film with electron beam radiation. Both monomers copolymerized and produced a clear, hard coating. The hybrid film coating showed much better adhesion, higher surface energy and more abrasion resistance than a crosslinked hexanediol diacrylate coating alone.

EXAMPLE 9

Same as Example 1, where 3,4-epoxycyclohexylmethyl-3,4-epoxycyclohexane carboxylate was blended with various ratios of a fluorinated epoxy monomer (such as heptadecafluorononyl oxirane) or a perfluorinated divynil ether. The blend was used to coat fabrics and non-woven substrates. The coated substrate showed hydrophobic and oleophobic surface properties without change in the material's porosity and breathability. This application (coating fabric and non-woven fibers) benefits the most from combining flash evaporation vapor deposition with the cationic polymerization mechanism. Atmospheric coating is not applicable for these kinds of materials because of the resulting blocking of pores. Similarly, acrylate coating in vacuum is not efficient because the liquid monomer deposited on the backside of the fibers does not receive enough radiation (EB or UV) for curing. In the case of cationically polymerizable monomers, the continuing post-radiation reaction (dark curing) helps to fully cure all monomer deposited on the three-dimensional fabric or fiber. Surface coating and treatment of fabric and non-woven fibers have great application in the biomedical and filtration industries.

EXAMPLE 10

Same as Example 9, where the substrate was a special-grade polyester film intended for display applications. As little as 0.015 microns of that fluorinated coating turned the base film into an anti-smudge, contaminant-resistant surface. The contact angle with water was >105 degrees and the surface energy was <25 dyne/cm.

EXAMPLE 11

Same as Example 1, where a hydrocarbon monomer (divinylbenzene, a diene, or a cycloaliphatic diene) was used. The crosslinked thermoset hydrocarbon coating showed a very high chemical resistance towards acids, bases and organic solvents. A one-micron thick coating of this material is characterized by very low infrared absorption (<3%), especially at wavelengths between 4 and 12 microns. It is impossible to achieve this level of infrared transmittance with acrylate-based (free-radical cured) films. The carbon-oxygen bond in acrylate polymers strongly absorbs infrared light at 4–12 micron range. Infrared transmitting materials are very important for heat mirror and signature control applications. The same chemically-inert coating was characterized with a low dielectric constant (<2.5), a low dissipation factor (<1%) and a high dielectric strength, which make the coating perfect for battery and capacitor applications.

EXAMPLE 11

Same as Example 1, where electron donor monomers, such as N-vinylcarbazole, vinyl pyridine, or vinylimidazole, were blended with various ratios of an electron-rich crosslinking agent such as divinyl benzene and doped with hole-transporting and electron-transporting components, such as triphenyl diamine derivatives and aluminum quinolinolate respectively. The blend was used to coat electrically conductive ITO-coated glass or plastic substrates. The coated substrate shows photoconductive and luminescence properties. This kind of photonic coating has advantageous applications in xerography and light-emitting industries. Acrylate based coatings produced less efficient photoconductive and luminescence materials because of the reactivity of the acrylate ester moiety, which acts as a charge trap.

These examples demonstrate the feasibility of manufacturing thin polymeric coatings by vapor deposition of cation-polymerizable monomers. The process possesses the advantages of being solvent-free, environmentally safe, and high rate. Large areas of coating (with web speeds higher than 1,500 ft/min) can be applied at low cost. The resulting products are in the form of highly uniform, defect-free, excellent adhesion coatings, which provide a better function as moisture and vapor barrier materials than heretofore achieved with prior-art acrylate-based films. Also the vacuum deposited cationic coatings exhibit very low dissipation (<1%) and high dielectric strength which make the coatings very promising materials for capacitor applications. Moreover, with this invention, entirely hydrocarbon (polyethylene-like or polystyrene-like materials) crosslinked thin coatings can be produced at high rate for various applications that require low infrared absorption, high chemical stability, low surface energy and low dielectric constant. In addition, the process of the invention is suitable for in-line vapor deposition of metal and ceramic layers to produce hybrid films.

With respect to prior-art processes of flash vaporization and cryocondensation of acrylate and metacrylate monomers, which polymerize through free-radical mechanisms, the polymerization process, which involves only materials that polymerize via cationic mechanisms, has the advantages of no oxygen inhibition; post-radiation curing (dark curing); low volume shrinkage; excellent adhesion to plastics and metals; low level of extractable components; absence of odor in the cured film; and low skin irritation.

Moreover, the cationically-curable monomers of the invention produce polymeric films that have better properties than attainable with prior-art materials. For example, the process enables the manufacture of films that provide higher moisture and oxygen barriers; low shrinking and better adhesion to metals, ceramics and plastics; high chemical resistance to acids, bases, and solvents; and low infrared absorption for low-emissivity coatings. Finally, the reactants' low viscosity and unsusceptibility to thermal polymerization make the process of evaporation easier to carry out.

Various changes in the details, steps and components that have been described may be made by those skilled in the art within the principles and scope of the invention herein illustrated and defined in the appended claims. For example, polypropylene, polyethylene, polytetrafluoroethylene (TEFLON®), polyimide (KAPTON®), polyamide (NYLON®), polyphenylsulfides, polycarbonate, cellulose derivatives, are equivalent materials that may be used instead of PET or other substrates to practice the invention. Therefore, while the present invention has been shown and described herein in what is believed to be the most practical and preferred embodiments, it is recognized that departures can be made therefrom within the scope of the invention, which is not to be limited to the details disclosed herein but is to be accorded the full scope of the claims so as to embrace any and all equivalent processes and products.

We claim:

1. A process for forming a solid polymeric structure from flash-evaporated vacuum-deposited cationically-curable monomeric material, the process comprising the following steps:

(a) preparing a mixture of a cationically-curable monomer with a thermally stable, chemically inactive at room temperature, cationic photoinitiator;

(b) flash-evaporating said mixture in vacuum to produce a vapor;

(c) condensing the vapor to produce a film; and (d) exposing said film to a radiation source to produce a polymeric solid film.

2. The process of claim 1, further comprising the step of:

(e) vacuum depositing an inorganic material over said polymeric solid film.

3. The process of claim 2, wherein steps (b)–(e) are repeated to produce a multilayer structure.

4. The process of claim 1, further comprising the step of vacuum depositing an inorganic material over a substrate, and then condensing the vapor over the inorganic material in step (c).

5. The process of claim 4, wherein the steps of vacuum depositing an inorganic material and condensing the vapor over the inorganic material are repeated to produce a multilayer structure.

6. The process of claim 1, wherein said monomer is selected from the group consisting of epoxies, cycloaliphatic epoxies, vinyl ethers, styrene, styrene derivatives, glycidyl derivatives, vinyl pyridines, vinyl carbazole, vinyl-carbazole derivatives, vinyl imidazole, vinyl-imidazole derivatives, oxetanes, dienes, and mixtures thereof.

7. The process of claim 1, wherein said cationic photoinitiator is selected from the group consisting of diaryl iodonium salts, triaryl sulfonium salts, and mixtures thereof.

8. The process of claim 1, wherein said monomer is a cycloalyphatic epoxy and said photoinitiator is a diaryl iodonium salt, and the monomer and photoinitiator are used to produce a low-shrinking film adapted to adhere to metal, ceramic, and plastic substrates.

9. The process of claim 1, wherein said monomer is selected from the group consisting of cycloalyphatic epoxies, hydrocarbon styrene derivatives, or mixtures thereof, said photoinitiator is a diaryl iodonium salt, and the monomer and photoinitiator are used to produce a gas- and vapor-barrier coating.

10. The process of claim 1, wherein said monomer is selected from the group consisting of perfluorodivinyl ether, a perfluoro epoxy, or mixtures thereof, said photoinitiator is a diaryl iodonium salt, and the monomer and photoinitiator are used to produce an anti-smudge, contaminant-resistant coating.

11. The process of claim 1, wherein said monomer is selected from the group consisting of divinylbenzenes, dienes, or mixtures thereof, said photoinitiator is a diaryl iodonium salt, and the monomer and photoinitiator are used to produce an infrared-transmitting, chemically-inert coating.

12. The process of claim 1, wherein said monomer is selected from the group consisting of divinylbenzenes, dienes, or mixtures thereof, said photoinitiator is a diaryl iodonium salt, and the monomer and photoinitiator are used to produce a low dielectric constant, high dielectric strength, and low dissipation factor coating.

13. The process of claim 1, wherein said monomer is selected from the group consisting of N-vinylcarbazole, vinyl pyridines, vinylimidazole, divinylbenzene, or mixtures thereof, said photoinitiator is a diaryl iodonium salt, and the monomer and photoinitiator are used to produce a photonic coating with photoconductivity and luminescence properties.

14. The process of claim 4, wherein said inorganic material is selected from the group consisting of aluminum, aluminum oxide, silicon oxide, and mixtures thereof.

15. The process of claim 5, wherein said inorganic material is selected from the group consisting of aluminum, aluminum oxide, silicon oxide, and mixtures thereof.

16. The process of claim 4, wherein said substrate is selected from the group consisting of polypropylene, polyethylene, polytetrafluoroethylene, polyethyleneglycol terphthlate, polyimide, polyamide, polyphenylsulfides, polycarbonate, and cellulose derivatives.

17. The process of claim 5, wherein said substrate is selected from the group consisting of polypropylene, polyethylene, polytetrafluoroethylene, polyethyleneglycol terphthlate, polyimide, polyamide, polyphenylsulfides, polycarbonate, and cellulose derivatives.

18. The process of claim 1, wherein said radiation source is an electron beam.

19. The process of claim 1, wherein said radiation source is a source of ultra-violet radiation.

20. The process of claim 1, wherein said mixture of a cationically-curable monomer with a thermally stable, chemically inactive at ambient conditions, cationic photoinitiator also includes a free-radical polymerizable monomer.

21. A process for forming a solid polymeric structure from cationically-curable monomeric material in a vacuum vapor deposition unit operating at a predetermined pressure, a predetermined evaporator temperature, and a predetermined condenser temperature, the process comprising the following steps:

(a) preparing a mixture of a cationically-curable monomer with a thermally stable, chemically inactive at ambient conditions, cationic photoinitiator, said monomer and photoinitiator having respective vaporization temperatures at said predetermined pressure that do not exceed said predetermined evaporator temperature, and having respective decomposition temperatures at said predetermined pressure that exceed said predetermined evaporator temperature;

(b) evaporating said mixture in said vapor deposition unit to produce a vapor at said predetermined pressure and evaporator temperature;

(c) condensing the vapor to produce a film; and (d) exposing said film to a radiation source to produce a polymeric solid film.

22. The process of claim 21, wherein said predetermined pressure is about $10^{-1}$ to $10^{-6}$ torr.

23. The process of claim 21, wherein said predetermined evaporator temperature is about 70° C.–350° C.

24. The process of claim 21, wherein said predetermined condenser temperature is about −20° C. to 30° C.

25. The process of claim 21, wherein said predetermined pressure is about $10^{-1}$ to $10^{-6}$ torr, said predetermined evaporator temperature is about 70° C.–350° C., and said predetermined condenser temperature is about −20° C. to 30° C.

26. The process of claim 21, further comprising the step of vacuum depositing an inorganic material over said polymeric solid film.

27. The process of claim 21, further comprising the step of vacuum depositing an inorganic material over a substrate, and then condensing the vapor over the inorganic material in step (c).

28. A polymeric structure prepared according to the process of claim 1.

29. A polymeric structure prepared according to the process of claim 2.

30. A polymeric structure prepared according to the process of claim 3.

31. A polymeric structure prepared according to the process of claim 4.

32. A polymeric structure prepared according to the process of claim 5.

33. A polymeric structure prepared according to the process of claim 20.

\* \* \* \* \*

UNITED STATES PATENT AND TRADEMARK OFFICE
CERTIFICATE OF CORRECTION

PATENT NO.     : 6,468,595 B1
DATED          : October 22, 2002
INVENTOR(S)    : Michael G. Mikhael et al.

It is certified that error appears in the above-identified patent and that said Letters Patent is hereby corrected as shown below:

<u>Title page, Item [54] and Column 1, line 1,</u>
Replace the word "VACCUM" with -- VACUUM --

Signed and Sealed this

Fourth Day of March, 2003

JAMES E. ROGAN
*Director of the United States Patent and Trademark Office*